United States Patent
Uno et al.

(10) Patent No.: US 11,139,427 B2
(45) Date of Patent: Oct. 5, 2021

(54) BONDED BODY AND ELASTIC WAVE ELEMENT

(71) Applicant: NGK INSULATORS, LTD., Nagoya (JP)

(72) Inventors: Yudai Uno, Nagoya (JP); Masashi Goto, Nagoya (JP); Tomoyoshi Tai, Inazawa (JP)

(73) Assignee: NGK INSULATORS, LTD., Nagoya (JP)

(*) Notice: Subject to any disclaimer, the term of this patent is extended or adjusted under 35 U.S.C. 154(b) by 0 days.

(21) Appl. No.: 17/128,857

(22) Filed: Dec. 21, 2020

(65) Prior Publication Data
US 2021/0111332 A1 Apr. 15, 2021

Related U.S. Application Data

(63) Continuation of application No. PCT/JP2019/017156, filed on Apr. 23, 2019.

(30) Foreign Application Priority Data

Jun. 22, 2018 (JP) .............................. JP2018-118503

(51) Int. Cl.
*H01L 41/08* (2006.01)
*H01L 41/312* (2013.01)
*H01L 41/187* (2006.01)

(52) U.S. Cl.
CPC ........ *H01L 41/312* (2013.01); *H01L 41/0815* (2013.01); *H01L 41/1873* (2013.01)

(58) Field of Classification Search
CPC ............... H01L 41/312; H01L 41/1873; H01L 41/0815
See application file for complete search history.

(56) References Cited

U.S. PATENT DOCUMENTS 10,541,667 B2 * 1/2020 Gilbert ............... H03H 9/02574
2004/0226162 A1 * 11/2004 Miura ................ H03H 9/02574
29/594

(Continued)

FOREIGN PATENT DOCUMENTS

DE 11201800012 T5 11/2018
JP 201486400 A 5/2014

(Continued)

OTHER PUBLICATIONS

International Search Report with English Translation issued in corresponding International Application No. PCT/JP2019/017156 dated Jun. 25, 2019 (4 pages).

(Continued)

*Primary Examiner* — Jaydi San Martin
(74) *Attorney, Agent, or Firm* — Flynn Thiel, P.C.

(57) ABSTRACT

A bonded body includes a piezoelectric single crystal substrate; a supporting substrate composed of a polycrystalline ceramic material or a single crystal material; a bonding layer provided on the piezoelectric single crystal substrate and having a composition of $Si_{(1-x)}O_x$ ($0.008 \leq x \leq 0.408$); and an amorphous layer provided between the supporting substrate and bonding layer, the amorphous layer containing oxygen atoms and argon atoms. A concentration of the oxygen atoms at a central part of the amorphous layer is higher than a concentration of the oxygen atoms at a peripheral part of the amorphous layer.

7 Claims, 4 Drawing Sheets

(56) References Cited

U.S. PATENT DOCUMENTS

| | | | |
|---|---|---|---|
| 2014/0210317 A1* | 7/2014 | Tai | H01L 41/053 |
| | | | 310/348 |
| 2016/0087192 A1* | 3/2016 | Doi | H01L 27/11507 |
| | | | 428/64.1 |
| 2018/0151797 A1* | 5/2018 | Akiyama | H01L 21/02 |
| 2018/0175283 A1 | 6/2018 | Akiyama et al. | |
| 2019/0007022 A1 | 1/2019 | Goto et al. | |
| 2019/0036009 A1 | 1/2019 | Tai et al. | |
| 2019/0036505 A1* | 1/2019 | Akiyama | H01L 41/1873 |
| 2021/0066577 A1* | 3/2021 | Tai | H01L 41/081 |

FOREIGN PATENT DOCUMENTS

| | | |
|---|---|---|
| JP | 2016225537 A | 12/2016 |
| WO | 2014077213 A1 | 5/2014 |
| WO | 2017134980 A1 | 8/2017 |
| WO | 2017163722 A1 | 9/2017 |

OTHER PUBLICATIONS

Written Opinion of International Searching Authority issued in corresponding International Application No. PCT/JP2019/017156 dated Jun. 25, 2019, 2019 (3 pages).

English Translation of the International Preliminary Report on Patentability, issued in corresponding International Application No. PCT/JP2019/017156 dated Dec. 30, 2020 (6 pages).

Office Action from German Patent Office issued in corresponding German Application No. 11 2019 002 430.2 with English Translation dated Apr. 8, 2021 (14 pages).

* cited by examiner

BONDED BODY AND ELASTIC WAVE ELEMENT

CROSS-REFERENCE TO RELATED APPLICATIONS

This is a continuation of PCT/JP2019/017156, filed Apr. 23, 2019, which claims priority to Japanese Application No. 2018-118503, filed Jun. 22, 2018, the entire contents of which are hereby incorporated by reference.

TECHNICAL FIELD

The present invention relates to a bonded body and an acoustic wave device.

BACKGROUND ARTS

An SOI substrate composed of a high resistance Si/SiO$_2$ thin film/Si thin film, has been widely used for realizing a high-performance semiconductor device. Plasma activation is used for realizing the SOI substrate. This is because the bonding can be realized at a relatively low temperature (400° C.). It has been proposed to use a composite substrate composed of similar Si/SiO$_2$ thin film/piezoelectric thin film for improving the characteristics of a piezoelectric device (patent document 1). According to patent document 1, the piezoelectric single crystal substrate composed of lithium niobate or lithium tantalate and silicon substrate with the silicon oxide layer formed thereon are activated by an ion activation method, followed by the bonding.

Further, a direct bonding method of a so-called FAB (Fast Atom Beam) system is known. According to this method, a neutralized atomic beam is irradiated onto each bonding surface at an ambient temperature to activate it, followed by direct bonding (patent document 2).

According to patent document 3, surfaces of a silicon substrate and lithium tantalate substrate are subjected to surface activation by a neutralized atomic beam and the surfaces are bonded with each other, so that an amorphous layer containing tantalum, silicon and argon atoms is generated along an interface between the silicon substrate and lithium tantalate substrate.

PATENT DOCUMENTS (Patent document 1) Japanese Patent Publication No. 2016-225537A
(Patent document 2) Japanese Patent Publication No. 2014-086400A
(Patent document 3) WO 2017/134980 A1

SUMMARY OF THE INVENTION

A lithium tantalate or lithium niobate single crystal used in an acoustic wave filter has a low thermal conductivity. Due to an increase of transmitted electric power resulting from recent increases of communication amounts and heat generation from surrounding devices provided by module fabrication, the acoustic wave device is susceptible to a temperature rise. As a result, the acoustic wave filter composed of a piezoelectric single crystal substrate could not be used for high performance communication terminal devices.

On the other hand, according to the method that a neutralized atomic beam is irradiated onto bonding surfaces of a piezoelectric single crystal substrate and supporting substrate according to a FAB (Fast Atom Beam) system to activate them which are directly bonded with each other, heat can be dissipated toward the side of the supporting substrate. The heat dissipation property is higher than the acoustic wave filter composed of the piezoelectric single crystal substrate only. However, a high temperature of about 80° C. is applied onto the bonded body of the piezoelectric single crystal substrate and supporting substrate, and warping may thus occur. It is considered that a large stress is applied on a crystal plane of the piezoelectric single crystal substrate due to a difference in thermal expansion of the piezoelectric single crystal substrate and supporting substrate.

An object of the present invention is, in a bonded body of a piezoelectric single crystal substrate and supporting substrate, to suppress the warping of the bonded body.

The present invention provides a bonded body comprising:
a piezoelectric single crystal substrate;
a supporting substrate comprising a polycrystalline ceramic material or a single crystal material;
a bonding layer provided on said piezoelectric single crystal substrate and having a composition of Si$_{(1-x)}$O$_x$ (0.008≤x≤0.408); and
an amorphous layer provided between said supporting substrate and said bonding layer, said amorphous layer comprising oxygen atoms and argon atoms,
wherein a concentration of said oxygen atoms at a central part of said amorphous layer is higher than a concentration of said oxygen atoms at a peripheral part of said amorphous layer.

The present invention further provides an acoustic wave device comprising:
the bonded body; and
an electrode provided on said piezoelectric single crystal substrate.

According to the invention, the bonding layer of the specific composition described above is provided so that the insulating property of the bonding layer can be improved.

Moreover, in the case that such a bonding layer is provided, a thin amorphous layer is generated along an interface between the bonding layer on the piezoelectric single crystal substrate and supporting substrate. However, as the thus obtained bonded body is heated, the warping of the bonded body may occur.

Thus, the inventors have researched the cause of the warping and reached the idea that the warping may possibly be generated due to the difference in thermal expansion of the piezoelectric single crystal substrate and supporting substrate. It is considered that the warping caused by the difference in the thermal expansion is difficult to absorb in the bonding layer and amorphous layer from the viewpoint of the structure.

Here, when the amorphous layer is generated along the bonding interface of the bonding layer on the piezoelectric single crystal substrate and supporting substrate, the inventors tried to change the structure of an emitting aperture of argon atomic beam, for example, for raising the energy intensity of the argon atomic beam at the central part of the bonding interface and for making the oxygen concentration at the central part higher than the oxygen concentration at the peripheral part of the amorphous layer on the bonding layer. The inventors then researched the effects on the warping of the bonded body upon heating. As a result, the warping of the bonded body upon heating was considerably reduced.

Although the reason is not clear, by providing in-plane distribution of the concentrations that the oxygen concentration at the central part of the amorphous layer is relatively high, the in-plane distribution of the thickness of the amorphous layer is adjusted so that the thickness at the central part is further increased. As a result, it is considered that the stress applied on the piezoelectric single crystal upon heating is relaxed and that the warping of the bonded body upon heating is suppressed.

EMBODIMENTS FOR CARRYING OUT THE INVENTION

The present invention will be described further in detail below, appropriately referring to drawings.

Figure 1A:
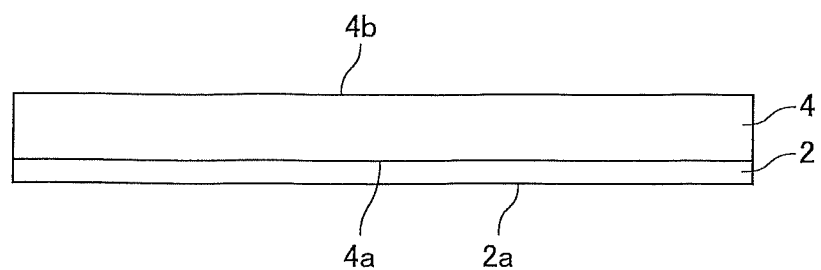
FIG. 1(a) shows the state that a bonding layer 2 is provided on a surface 4a of a piezoelectric single crystal substrate 4.

According to an embodiment shown in FIGS. 1 and 2, first, as shown in FIG. 1(a), a bonding layer 2 is provided on a surface 4a of a piezoelectric single crystal substrate 4. 4b represents a surface on the opposite side. At this time, irregularities may be present on a surface 2a of the bonding layer 2.

Figure 1B:
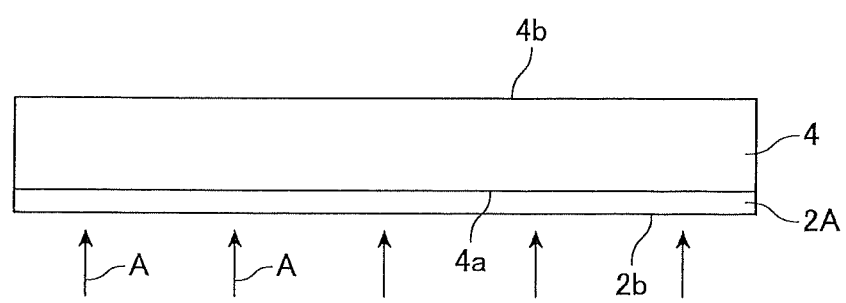
FIG. 1(b) shows the state that a surface 2b of a bonding layer 2A is activated by a neutralized beam A.

According to a preferred embodiment, the surface 2a of the bonding layer 2 is then subjected to a flattening process to form a flat surface 2b on the bonding layer, as shown in FIG. 1(b). The thickness of the bonding layer 2 is usually made smaller by the flattening process, resulting in a thinner bonding layer 2A (refer to FIG. 1(b)). However, the flattening process is not necessarily performed. A neutralized beam is then irradiated onto the surface 2b of the bonding layer 2A as arrows A to activate the surface of the bonding layer 2A to provide an activated surface.

Figure 1C:
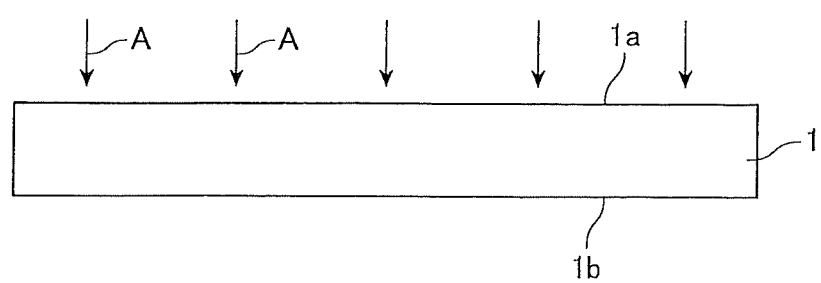
FIG. 1(c) shows the state that a surface 1a of a supporting substrate 1 is activated by a neutralized beam A.
Figure 2A:
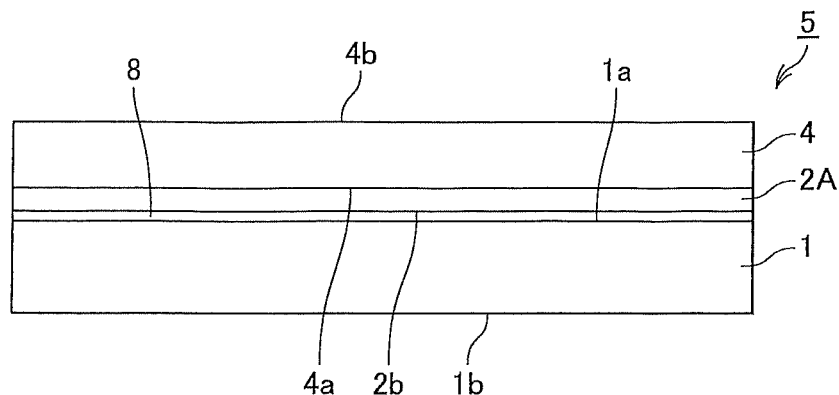
FIG. 2(a) shows the state that the piezoelectric single crystal substrate 4 and supporting substrate 1 are bonded with each other.

Further, as shown in FIG. 1(c), a neutralized beam A is irradiated onto the surface 1a of the supporting substrate 1 to activate it to provide an activated surface 1a. 1b represents a surface on the opposite side. As shown in FIG. 2(a), the activated surface 2b of the bonding layer 2A on the piezoelectric single crystal substrate 4 and activated surface 1a of the supporting substrate 1 are then directly bonded with each other to obtain a bonded body 5.

Figure 2B:
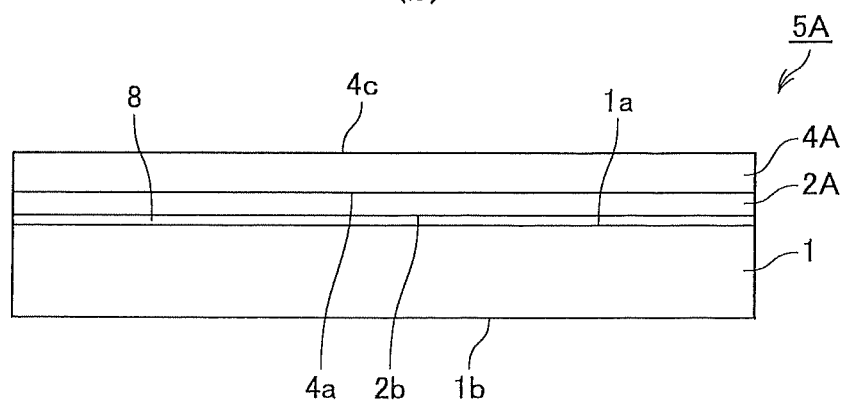
FIG. 2(b) shows the state that the piezoelectric single crystal substrate 4A is thinned by processing.

According to a preferred embodiment, the surface 4b of the piezoelectric single crystal substrate 4 of the bonded body 5 is further subjected to polishing for thinning the piezoelectric single crystal substrate 4A and to obtain a bonded body 5A, as shown in FIG. 2(b). 4c represents a polished surface.

Figure 2C:
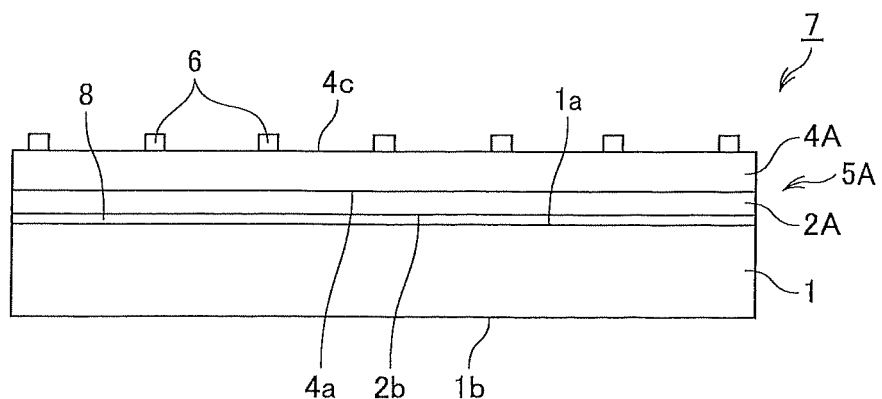
FIG. 2(c) shows the state that electrodes 6 are provided on the piezoelectric single crystal substrate 4A.

According to FIG. 2(c), predetermined electrodes 6 are formed on the polished surface 4c of the piezoelectric single crystal substrate 4A to produce an acoustic wave device 7.

Here, the amount of the energy irradiated onto each activated surface is appropriately adjusted to generate an amorphous layer 8 along an interface between the bonding layer 2A and supporting substrate 1, as shown in FIGS. 2(a) and 2(b).

Figure 3A:
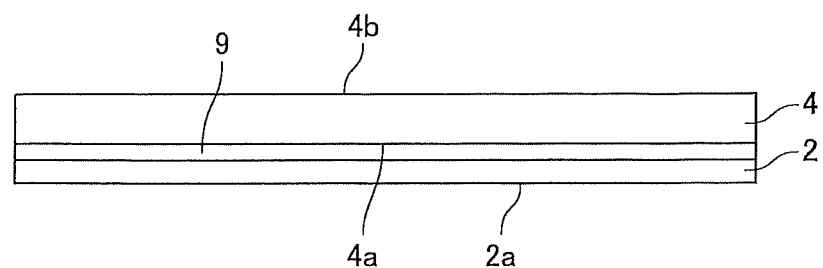
FIG. 3(a) shows the state that an intermediate layer 9 and bonding layer 2 are provided on a surface 4a of the piezoelectric single crystal substrate 4.
Figure 3B:
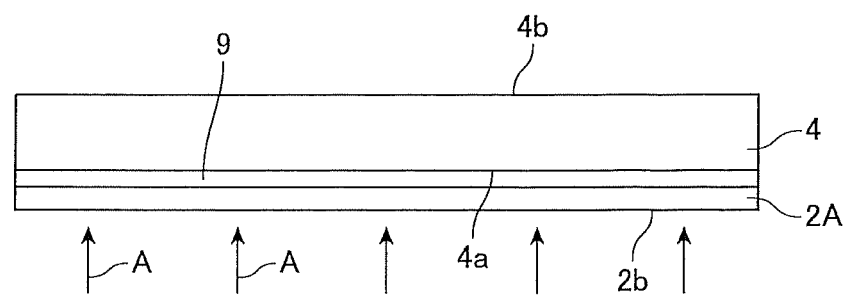
FIG. 3(b) shows the state that a surface 2b of the bonding layer 2A is activated by a neutralized beam A.

According to an embodiment shown in FIGS. 3 and 4, as shown in FIG. 3(a), an intermediate layer 9 is provided on a surface 4a of a piezoelectric single crystal substrate 4, and a bonding layer 2 is provided on the intermediate layer 9. The surface 2a of the bonding layer 2 is then subjected to flattening process to form a flat surface 2b on the bonding layer, as shown in FIG. 3(b). The thickness of the bonding layer 2 is usually made smaller by the flattening process to provide a thinner bonding layer 2A. A neutralized beam is then irradiated onto the surface 2b of the bonding layer 2A as arrows A to activate the surface of the bonding layer 2A to provide an activated surface.

Figure 3C:
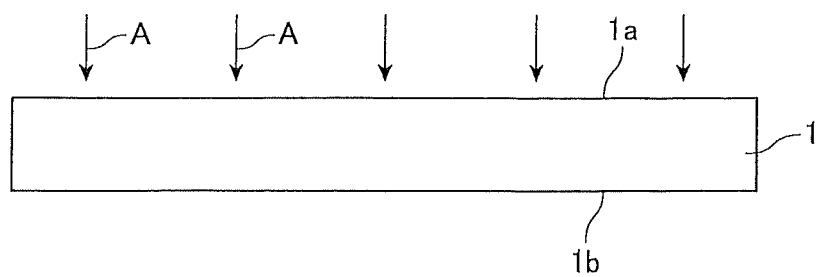
FIG. 3(c) shows the state that the surface 1a of the supporting substrate 1 is activated by a neutralized beam A.

Further, as shown in FIG. 3(c), a neutralized beam A is irradiated onto the surface 1a of the supporting substrate 1 to activate it to provide an activated surface 1a. Then, as shown in FIG. 4(a), the activated surface 2b of the bonding layer 2A on the piezoelectric single crystal substrate 4 and activated surface 1a of the supporting substrate 1 are directly bonded with each other to obtain a bonded body 15.

Figure 4A:
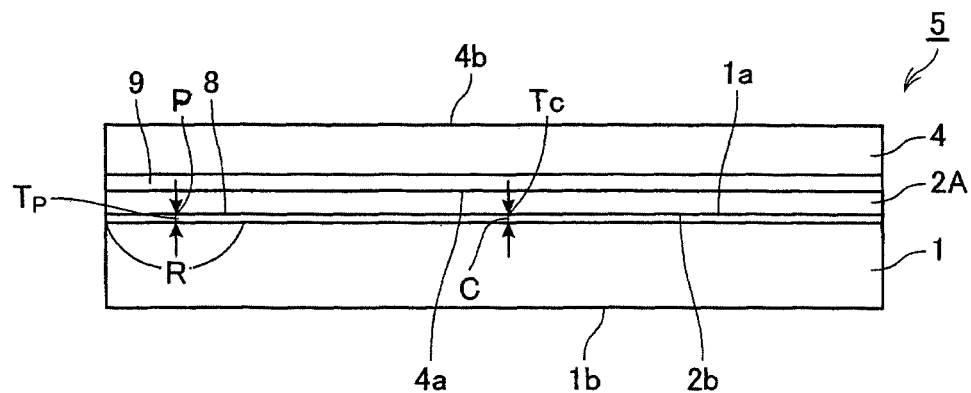
FIG. 4(a) shows the state that the piezoelectric single crystal substrate 4 and supporting substrate 1 are bonded with each other.
Figure 4B:
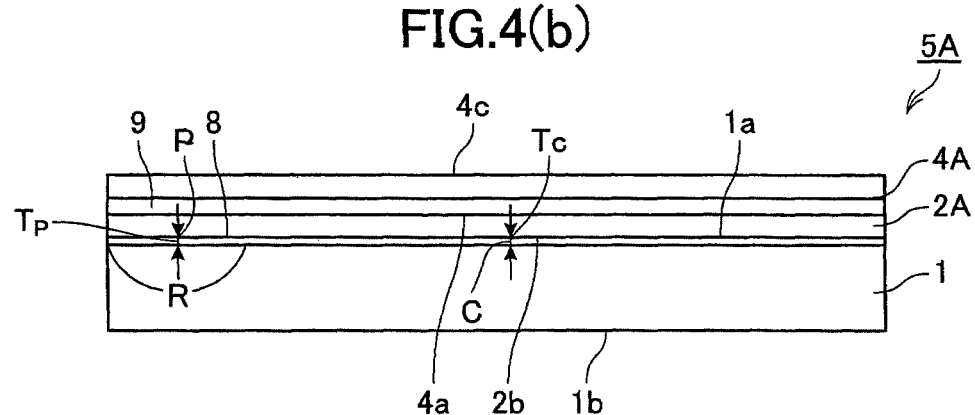
FIG. 4(b) shows the state that the piezoelectric single crystal substrate 4A is thinned by processing.
Figure 4C:
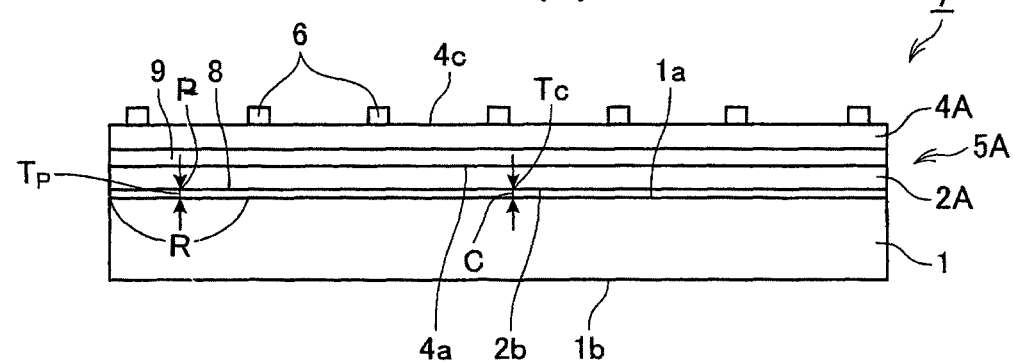
FIG. 4(c) shows the state that electrodes 6 are provided on the piezoelectric single crystal substrate 4A.

According to a preferred embodiment, the surface 4b of the piezoelectric single crystal substrate 4 of the bonded body 15 is further subjected to polishing to thin a piezoelectric single crystal substrate 4A to obtain a bonded body 15A, as shown in FIG. 4(b). As shown in FIG. 4(c), predetermined electrodes 6 are formed on a polished surface 4c of the piezoelectric single crystal substrate 4A to produce an acoustic wave device 17.

Here, the amount of the energy irradiated onto each activated surface is appropriately adjusted to generate an amorphous layer 8 along an interface between the bonding layer 2A and supporting substrate 1, as shown in FIGS. 4(a) and 4(b).

Respective constituents of the present invention will be described further in detail below.

(Supporting Substrate)

According to the present invention, the supporting substrate 1 is composed of a polycrystalline ceramic material or single crystal substrate. The single crystal substrate forming the supporting substrate 1 may preferably be silicon or sapphire. Further, the polycrystalline ceramic material may preferably be a material selected from the group consisting of mullite, cordierite, translucent alumina and sialon.

(Piezoelectric Single Crystal Substrate)

Specifically, as the materials of the piezoelectric single crystal 4 and 4A, single crystals of lithium tantalate (LT), lithium niobate (LN), lithium niobate-lithium tantalate solid solution, quartz and lithium borate may be listed. Among them, LT or LN is more preferred. As LT or LN has a high propagation speed of a surface acoustic wave and large electro-mechanical coupling factor, it is preferred for use in a piezoelectric surface acoustic wave device for high frequency and wide-band frequency applications. Further, the normal direction of the main surface of the piezoelectric single crystal substrate 4 or 4A is not particularly limited. However, in the case that the piezoelectric single crystal substrate 4 or 4A is made of LT, for example, it is preferred to use a substrate rotated from the Y-axis to the Z-axis by 36 to 47° (for example 42°) with respect to the X-axis, which is a direction of propagation of a surface acoustic wave, because of a low propagation loss. In the case that the piezoelectric single crystal substrate 4 or 4A is made of LN, it is preferred to use a substrate rotated from the Y-axis to the Z-axis by 60 to 68° (for example 64°) with respect to the X-axis, which is a direction of propagation of a surface acoustic wave, because of a lower propagation loss. Further, although the size of the piezoelectric single crystal substrate 4 or 4A is not particularly limited, for example, the diameter may be 50 to 150 mm and thickness may be 0.2 to 60 μm.

(Bonding Layer)

According to the present invention, the bonding layer 2A is provided between the supporting substrate 1 and piezoelectric single crystal substrate 4 or 4A, and the bonding layer 2A has a composition of $Si_{(1-x)}O_x$ ($0.008 \leq x \leq 0.408$). The composition is a composition whose oxygen concentration is considerably lower than that of $SiO_2$ (x=0.667). As the piezoelectric single crystal substrate 4 or 4A is bonded to the supporting substrate 1 through the bonding layer 2A of the silicon oxide $Si_{(1-x)}O_x$ of this composition, the bonding strength can be made high and the insulating property of the bonding layer 2A can be made high.

In the case that x is lower than 0.008 in the composition of $Si_{(1-x)}O_x$ forming the bonding layer 2A, the electrical resistance of the bonding layer 2A is low and a desired insulating property cannot be obtained. Thus, x is made 0.008 or higher, x may preferably be made 0.010 or higher, more preferably be made 0.020 or higher, and most preferably be made 0.024 or higher. Further, in the case that x exceeds 0.408, the bonding strength is lowered and the separation of the piezoelectric single crystal substrate 4 or 4A tends to occur. x is thus made 0.408 or lower and more preferably be made 0.225 or lower.

The electrical resistivity of the bonding layer 2A may preferably be $4.8 \times 10^3$ Ω·cm or higher, more preferably be $5.8 \times 10^3$ Ω·cm or higher, and particularly preferably be $6.2 \times 10^3$ Ω·cm or higher. Further, the electrical resistivity of the bonding layer 2A is generally $1.0 \times 10^8$ Ω·cm or lower.

Although the thickness of the bonding layer 2A is not particularly limited, it may preferably be 0.01 to 10 μm and more preferably be 0.01 to 0.5 μm, on the viewpoint of production cost.

Although the film-forming method of the bonding layer 2A is not particularly limited, a sputtering method, chemical vapor deposition (CVD) method and vapor deposition method may be listed. Here, particularly preferably, during reactive sputtering using a sputtering target of Si, the amount of oxygen gas flowing into a chamber is adjusted so that the oxygen ratios (x) in the bonding layer 2A can be controlled.

Although specific conditions are appropriately selected depending on the specification of the chamber, according to a preferred example, the total pressure is made 0.28 to 0.34 Pa, the partial pressure of oxygen is made $1.2 \times 10^{-3}$ to $5.7 \times 10^{-2}$ Pa and the film-forming temperature is made an ambient temperature. Further, Si doped with B is exemplified as the Si target. As described later, the amount of B (boron) as an impurity is controlled at about $5 \times 10^{18}$ atoms/$cm^3$ to $5 \times 10^{19}$ atoms/$cm^3$ at an interface between the bonding layer 2A and supporting substrate 1. It is thereby possible to obtain the insulation property of the bonding layer 2A more assuredly.

(Intermediate Layer)

An intermediate layer 9 may be further provided between the bonding layer 2A and piezoelectric single crystal substrate 4 or 4A. This intermediate layer 9 preferably improves the adhesion of the bonding layer 2A and piezoelectric single crystal substrate 4 or 4A, and specifically intermediate layer 9 may preferably be composed of $SiO_2$, $Ta_2O_5$, $TiO_2$, $ZrO_2$, $HfO_2$, $Nb_2O_3$, $Bi_2O_3$, $Al_2O_3$, MgO, AlN or $Si_3N_4$. Most preferably, the intermediate layer is composed of $SiO_2$.

(Amorphous Layer)

According to the present invention, an amorphous layer 8 is provided between the supporting substrate 1 and bonding layer 2A. The amorphous layer 8 contains at least oxygen atoms and argon atoms. Preferably, the amorphous layer 8 contains one or more elements (excluding oxygen element) forming the supporting substrate 1. In the case that the element forming the supporting substrate 1 is of a single kind, the element forming the amorphous layer 8 is also of a single kind. In the case that plural kinds of the elements forming the supporting substrate 3 are present, the element (s) forming the amorphous layer 8 is of a single kind or plural kinds among them.

According to the present invention, the concentration of oxygen atoms at the central part C of the amorphous layer 8 is made higher than the concentration of oxygen atoms at the peripheral part P of the amorphous layer 8 (see FIGS. 4(a) to 4(c)). Here, in the specification, the central part C of the amorphous layer 8 means a center of the amorphous layer 8 in the case that the amorphous layer 8 is viewed in a plan view. Further, the peripheral part P of the amorphous layer 8 is measured at each of three positions in a ring-shaped region R defined by a width of 5 to 10 mm from an end part (edge) in the direction toward the center of the amorphous layer 8, and the average value is taken.

The oxygen concentration at the central part of the amorphous layer 8 may preferably be 1.08 atom % or higher and more preferably be 1.1 atom % or higher, from the viewpoint of electrical conductivity. Further, the oxygen concentration at the central part of the amorphous layer 8 may preferably be 40.8 atom %.

The oxygen concentration at the peripheral part of the amorphous layer 8 may preferably be 0.8 atom % or higher and more preferably be 1.0 atom % or higher, from the viewpoint of electrical conductivity. Further, the oxygen concentration at the peripheral part of the amorphous layer 8 may preferably be 39.8 atom % or lower.

From the viewpoint of reducing the warping of the bonded body 5, 5A, 15 or 15A upon heating, the difference between the concentration of oxygen atoms at the central part and the concentration of oxygen atoms at the peripheral part of the amorphous layer 8 may preferably be 1.0 atom % or larger and more preferably be 2.0 atom % or larger. In other words, the concentration of oxygen atoms at the central part of the amorphous layer 8 is preferably higher than the concentration of oxygen atoms at the peripheral part of the amorphous layer 8 by 1.0 atom % or larger and more preferably by 2.0 atom % or larger.

According to a preferred embodiment, the thickness Tc at the central part C of the amorphous layer 8 is larger than the thickness Tp at the peripheral part P of the amorphous layer 8 (see FIGS. 4(a) to 4(c)). It is thereby possible to reduce the warping of the bonded body 5, 5A, 15 or 15A upon heating. From this viewpoint, the difference between the thickness Tc at the central part of the amorphous layer 8 and the thickness Tp at the peripheral part P of the amorphous layer 8 may preferably be 0.5 nm or larger and more preferably be 1.0 nm or larger.

Further, the thickness at the central part of the amorphous layer 8 may preferably be 2.8 to 8 nm and more preferably be 3.2 to 8 nm. Further, the thickness at the peripheral part of the amorphous layer 8 may preferably be 1.0 to 2.8 nm and more preferably be 1.2 to 2.6 nm.

According to a preferred embodiment, the concentration of argon atoms at the central part C of the amorphous layer 8 is made higher than the concentration of argon atoms at the peripheral part P of the amorphous layer 8 (see FIGS. 4 (a) to 4(c)). Here, in the specification, the central part C of the amorphous layer 8 means the center of the amorphous layer 8 in the case that the amorphous layer 8 is viewed in a plan view. Further, the peripheral part P of the amorphous layer 8 means that the measurement is performed at three positions in a ring-shaped region R in the direction from the end part (edge) toward the center of the amorphous layer in a width of 5 to 10 mm and that the average value is calculated.

The concentration of argon atoms at the central part of the amorphous layer 8 may preferably be 2.1 atom % or higher and more preferably be 2.4 atom % or higher, from the viewpoint of bonding strength. Further, the concentration of argon atoms at the central part of the amorphous layer is usually 5.0 atom % or lower and preferably 4.8 atom % or lower.

The concentration of argon atoms at the peripheral part of the amorphous layer 8 may preferably be 1.1 atom % or higher and more preferably be 1.8 atom % or higher, from the viewpoint of bonding strength. Further, the concentration of argon atoms at the peripheral part of the amorphous layer is usually 3.0 atom % or lower and preferably be 2.5 atom % or lower.

From the viewpoint of reducing the warping of the bonded body 5, 5A, 15 or 15A upon heating, the difference between the concentration of argon atoms at the central part and the concentration of argon atoms at the peripheral part of the amorphous layer 8 may preferably be 1.0 atom % or higher and more preferably be 1.5 atom % or higher. In other words, the concentration of argon atoms at the central part of the amorphous layer 8 may preferably be higher than the concentration of argon atoms at the peripheral part of the amorphous layer 8 by 1 atom % or larger and more preferably be by 1.5 atom % or larger.

Further, the presence of the amorphous layer 8 is to be confirmed as follows.
Measuring System:
The microstructure is observed using a transmission-type electron microscope "H-9500" supplied by Hitachi High-Tech Corporation.
Measuring Conditions:
A sample of a thinned piece is observed by FIB (Focused Ion Beam method) at an accelerating voltage of 200 kV.

The concentrations of the respective atoms in the amorphous layer 8 is to be measured as follows.
Measuring System:
The elementary analysis is performed using an elementary analyzing system ("JEM-ARM200F" supplied by JEOL Ltd.).
Measurement Conditions:
A sample of a thinned piece is observed by FIB (Focused Ion Beam method) at an accelerating voltage of 200 kV.
(Preferred Manufacturing Conditions)
The arithmetic average roughness Ra of the surface of the bonding layer 2A may preferably be 1 nm or smaller and more preferably be 0.3 nm or smaller. Further, the arithmetic average roughness Ra of the surface 1a of the supporting substrate 1 may preferably be 1 nm or smaller and more preferably be 0.3 nm or smaller. By this, the bonding strength of the supporting substrate 1 and bonding layer 2A is further improved.

The method of flattening the surfaces 2b of the bonding layer 2A and the surface 1a of the supporting substrate 1 includes lapping, chemical mechanical polishing (CMP) or the like.

According to a preferred embodiment, the surface 2b of the bonding layer 2A and the surface 1a of the supporting substrate 1 can be activated by a neutralized beam. Particularly, in the case that the surface 2b of the bonding layer 2A and the surface 1a of the supporting substrate 1 are flat surfaces, the direct bonding can be easily performed.

When the activation of the surfaces is performed using the neutralized beam, it is preferred to use a system described in Japanese Patent Publication No. 2014-086400A to generate the neutralized beam, which is irradiated. That is, a high-speed atomic beam source of saddle field type is used as the beam source. Then, argon gas is introduced into the chamber and a high voltage is applied onto electrodes from a direct current electric source. By this, an electric field of a saddle field type generated between the electrode (positive electrode) and a housing (negative electrode) causes the motion of electrons, e, so that atomic and ion beams derived from the argon gas are generated. Among the beams reached at a grid, the ion beam is neutralized at the grid, and the beam of neutral atoms is emitted from the high-speed atomic beam source.

In the activation step by beam irradiation, the voltage may preferably be made 0.5 to 2.0 kV, and the current may preferably be made 50 to 200 mA.

In the case that a high-speed atomic beam is irradiated onto the piezoelectric single crystal substrate 4 and supporting substrate 1, a grid is used in which a distribution is provided in the sizes, directions and inclination of the holes, so that a larger amount of the beam is irradiated onto the central part. Specifically, as to a square region having the dimensions of 30 mm and 30 mm positioned at the central part of the grid, a grid may be used in which the central part of the substrate to be irradiated by the beam is positioned on an extended line connecting the centers on the incident side and on the emitting side of the grid hole, or the sizes of the grid holes in the square region having dimensions of 30 mm and 30 mm at the central part of the grid are made larger than those in the other region by 15 to 30%. Alternatively, the flow rate of Ar gas may be made larger by 40% only in the region of 30 mm at the central part of the grid, so that the distribution can be provided in the irradiation amount of the beam. However, according to the present invention, it is not limited to the methods described above, it is permitted as long as a larger amount of the beam is irradiated onto the central part than the peripheral part as a result.

Then, the activated surfaces are contacted and bonded with each other under a vacuum atmosphere. The temperature at this time may be an ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

The application of each of the bonded bodies 5, 5A, 15 and 15A of the present invention is not particularly limited, and it may preferably be applied as an acoustic wave device or optical device.

As the acoustic wave devices 7 and 17, a surface acoustic wave device, Lamb wave-type device, thin film resonator (FBAR) or the like is known. For example, the surface acoustic wave device is produced by providing input side IDT (Interdigital transducer) electrodes (also referred to as comb electrodes or interdigitated electrodes) for oscillating a surface acoustic wave and IDT electrodes on the output side for receiving the surface acoustic wave on the surface of the piezoelectric single crystal substrate. By applying a high frequency signal on the IDT electrodes on the input side, an electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

A metal film may be provided on a bottom surface of the piezoelectric single crystal substrate 4 or 4A. After the Lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surface 4b or 4c of the piezoelectric single crystal substrate 4 or 4A and that the metal film on the piezoelectric single crystal substrate 4 or 4A is exposed through a cavity provided in the supporting body 1. Materials of such metal films include aluminum, an aluminum alloy, copper, gold or the like, for example. Further, in the case that the Lamb wave type device is produced, a composite substrate having the piezoelectric single crystal substrate 4 or 4A without the metal film may be used on the bottom surface.

Further, a metal film and an insulating film may be provided on the bottom surface of the piezoelectric single crystal substrate 4 or 4A. The metal film plays a role of electrodes in the case that the thin film resonator is produced as the acoustic wave device. In this case, the thin film resonator has the structure that electrodes are formed on the upper and bottom surfaces of the piezoelectric single crystal substrate 4 or 4A and the insulating film is made a cavity to expose the metal film on the piezoelectric single crystal substrate. Materials of such metal films include molybdenum, ruthenium, tungsten, chromium, aluminum or the like, for example. Further, materials of the insulating films include silicon dioxide, phosphorus silicate glass, boron phosphorus silicate glass or the like.

Further, as the optical device, an optical switching device, wavelength conversion device and optical modulating device may be listed. Further, a periodic domain inversion structure may be formed in the piezoelectric single crystal substrate 4 or 4A.

In the case that the present invention is applied to the optical device, the size of the optical device can be reduced. Further, particularly in the case that the periodic domain inversion structure is formed, it is possible to prevent the deterioration of the periodic domain inversion structure by heat treatment. Further, as the materials of the bonding layers 2A of the present invention are highly insulating, the generation of domain inversion is prevented during the processing by the neutralized beam before the bonding, and the shape of the periodic domain inversion structure formed in the piezoelectric single crystal substrate 4 or 4A is hardly disordered.

EXAMPLES

Inventive Example 1

The bonded body 5A of the inventive example 1 shown in table 1 was produced, according to the method described referring to FIGS. 1 and 2.

Specifically, a lithium tantalate substrate (LT substrate) was used having an OF (orientation flat) part, a diameter of 4 inches and a thickness of 250 µm as the piezoelectric single crystal substrate 4. A 46° Y-cut X-propagation LT substrate in which the propagation direction of surface acoustic wave (SAW) was made X and the cutting angle was of a rotated Y-cut plate, as the LT substrate. The surface 4a of the piezoelectric single crystal substrate 4 was subjected to mirror surface polishing so that the arithmetic average roughness Ra reached 0.3 nm. Further, Ra was measured by an atomic force microscope (AFM) in a visual field of 10 µm×10 µm.

Then, the bonding layer 2 was film-formed on the surface 4a of the piezoelectric single crystal substrate 4 by a direct current sputtering method. Si doped with boron was used as a target. Further, oxygen gas was introduced as an oxygen source. At this time, the amount of the introduced oxygen gas was changed to change the total pressure of the atmosphere and partial pressure of oxygen in a chamber, so that the oxygen ratio (x) in the bonding layer 2 was adjusted. The thickness of the bonding layer 2 was made to be 100 to 200 nm. The arithmetic average roughness Ra of the surface 2a of the bonding layer 2 was 0.2 to 0.6 nm.

Then, the bonding layer 2 was subjected to chemical mechanical polishing (CMP) so that the film thickness was made to be 80 to 190 µm and Ra was made to be 0.08 to 0.4 nm.

Further, as the supporting substrate 1, a supporting substrate 1 composed of Si and having the orientation flat (OF) part, a diameter of 4 inches and a thickness of 500 µm was prepared. The surfaces 1a and 1b of the supporting substrate 1 were finished by chemical mechanical polishing (CMP) so that the respective arithmetic average roughnesses Ra reached 0.2 nm.

Then, the flat surface 2b of the bonding layer 2A and surface 1a of the supporting substrate 1 were cleaned to remove the contamination, followed by introduction into a vacuum chamber. After it was evacuated to the order of $10^{-6}$ Pa, a high-speed atomic beam of 180 kJ was irradiated onto the bonding surfaces 1a and 2b of the respective substrates. Then, after the beam-irradiated surface (activated surface) 2b of the bonding layer 2A and activated surface 1a of the supporting substrate 1 were contacted with each other, the substrates 1 and 4 were bonded by pressurizing at 10000N for 2 minutes (refer to FIG. 2(a)).

At this time, a grid in which the sizes of the grid holes are made larger by 20% only in the region of sizes of 30 mm×30 mm at the central part was used, so that a larger amount of the argon atomic beam was irradiated onto the central parts of the respective surfaces.

Then, the surface 4b of the piezoelectric single crystal substrate 4 was then subjected to grinding and polishing so that the thickness was changed from the initial 250 µm to 1 µm (refer to FIG. 2(b)).

The oxygen ratio (x) of the bonding layer 2A of the thus obtained bonded body 5A was measured by EDS according to the following conditions. Here, the bonding layer 2A had a composition of $Si_{(0.95)}O_{0.05}$.

Measuring System:
an elementary analysis system ("JEM-ARM200F" supplied by JEOL Ltd.).

Measurement Conditions:
A sample of a thinned piece was observed by FIB (Focused Ion Beam method) at an accelerating voltage of 200 kV.

Further, the concentrations of the respective atoms in the amorphous layer was measured at the bonding interface between the bonding layer 2A and supporting substrate 1. Further, the thickness of the amorphous layer 8 was measured as follows.

Measuring System:
The microstructure was observed using a transmission-type electron microscope ("H-9500" supplied by Hitachi High-Tech Corporation).

Measuring Conditions:

A sample of a thinned piece was observed by FIB (Focused Ion Beam method) at an accelerating voltage of 200 kV.

The measurement results were shown in Table 1.

Further, the thus obtained bonded body was heated at 80° C., and the value of SORI was measured. The results were shown in Table 1.

When the SORI was measured, a laser displacement meter "LK-G5000" supplied by Keyence corporation was used, the information of the height of a wafer mounted on a movable table was measured, and the scanning was performed on lines. The measurement was performed on the orientation flat and on the two lines in horizontal and vertical directions of the substrate. The SORI was defined as a larger value of the measured SORI values.

layer 9 composed of silicon oxide was provided on the piezoelectric single crystal substrate 4 and the bonding layers 2 and 2A were provided on the intermediate layer 9, while the specific conditions were made the same as those of the Inventive example 1.

The oxygen ratio (x) of the bonding layer 2A of the thus obtained bonded body 15A was measured. Further, the concentrations of the respective atoms of the amorphous layer 8, the thickness of the amorphous layer 8 and SORI upon heating at 80° C. were measured. The results are shown in Table 1.

As shown in Table 1, according to the Inventive example 2, the oxygen concentration, argon concentration and thickness at the central part of the amorphous layer 8 were larger than the oxygen concentration, argon concentration and

TABLE 1

|  |  | Inventive example 1 |  |  | Inventive example 2 |  |  |
|---|---|---|---|---|---|---|---|
| Piezoelectric single crystal substrate |  | Lithium tantalate |  |  | Lithium tantalate |  |  |
| Intermediate layer |  | — |  |  | $SiO_2$ |  |  |
| Bonding layer |  | $Si_{(0.95)}O_{0.05}$ |  |  | $Si_{(0.95)}O_{0.05}$ |  |  |
| Supporting substrate |  | Si |  |  | Si |  |  |
| FAB irradiation amount (kJ) |  | 180 |  |  | 180 |  |  |
| Structure of emitting aperture of beam |  | Concentrated on center |  |  | Concentrated on center |  |  |
| Concentration of |  | Si | O | Ar | Si | O | Ar |
| atoms in amorphous | Central part | 85.7 | 9.5 | 4.8 | 85.9 | 9.4 | 4.7 |
| layer (atom %) | Peripheral part | 91.6 | 6.4 | 2.0 | 91.6 | 6.6 | 1.8 |
| Thickness of | Central part |  | 3.6 |  |  | 3.5 |  |
| amorphous layer (nm) | Peripheral part |  | 2.5 |  |  | 2.3 |  |
| SORI upon heating at 80° C. (um) |  |  | 330 |  |  | 360 |  |

As shown in Table 1, according to the Inventive example 1, the oxygen concentration, argon concentration and thickness at the central part of the amorphous layer 8 were larger than the oxygen concentration, argon concentration and thickness at the peripheral part of the amorphous layer 8, and SORI upon heating at 80° C. was as low as 330 μm.

Inventive Example 2

The bonded body 15A was produced according to the method shown in FIGS. 3 and 4. However, the intermediate thickness at the peripheral part of the amorphous layer 8, and SORI upon the heating at 80° C. was as low as 360 μma.

Comparative Example 1

The bonded body 5A was produced and evaluated according to the same procedure as that of the Inventive example 1. However, according to the present example, the structure of the emitting aperture of the argon atomic beam was made as follows, so that the argon atomic beam was irradiated substantially uniformly onto the whole of the bonding surfaces 2b and 1a. The results were shown in Table 2.

TABLE 2

|  |  | Comparative example 1 |  |  | Comparative example 2 |  |  | Comparative example 3 |  |  |
|---|---|---|---|---|---|---|---|---|---|---|
| Piezoelectric single crystal substrate |  | Lithium tantalate |  |  | Lithium tantalate |  |  | Lithium tantalate |  |  |
| Intermediate layer |  | — |  |  | $SiO_2$ |  |  | — |  |  |
| Bonding layer |  | $Si_{(0.95)}O_{0.05}$ |  |  | $Si_{(0.95)}O_{0.05}$ |  |  | $Si_{(0.95)}O_{0.05}$ |  |  |
| Supporting substrate |  | Si |  |  | Si |  |  | Si |  |  |
| FAB irradiation amount (kJ) |  | 180 |  |  | 180 |  |  | 360 |  |  |
| Structure of emitting aperture of beam |  | Prior structure |  |  | Prior structure |  |  | Prior structure |  |  |
| Concentration of |  | Si | O | Ar | Si | O | Ar | Si | O | Ar |
| atoms in amorphous | Central part | 90.9 | 6.8 | 2.3 | 90.9 | 6.9 | 2.2 | 85.7 | 9.6 | 4.7 |
| layer (atom %) | Peripheral part | 91.0 | 6.8 | 2.2 | 90.7 | 7.0 | 2.3 | 85.6 | 9.6 | 4.8 |
| Thickness of | Central part |  | 2.6 |  |  | 2.5 |  |  | 3.4 |  |
| amorphous layer (nm) | Peripheral part |  | 2.6 |  |  | 2.7 |  |  | 3.5 |  |
| SORI upon heating at 80° C. (um) |  |  | 660 |  |  | 670 |  |  | 610 |  |

As shown in Table 2, according to the Comparative example 1, the oxygen concentration and thickness at the central part of the amorphous layer 8 were the same as the oxygen concentration and thickness at the peripheral part 8, and the SORI upon heating at 80° C. was as large as 660p m.

Comparative Example 2

The bonded body 15A was produced and evaluated according to the same procedure as that of the Inventive example 2. However, according to the present example, an argon atomic beam was irradiated substantially uniformly over the whole of the bonding surface 2b and 1a. The results are shown in Table 2.

As shown in Table 2, according to the Comparative example 2, the oxygen concentration, thickness and argon concentration at the central part of the amorphous layer 8 were smaller than the oxygen concentration, thickness and argon concentration at the peripheral part of the amorphous layer 8, the SORI upon heating at 80° C. was as large as 670 μm.

Comparative Example 3

The bonded body 5A was produced according to the same procedure as that of the Comparative example 1. However, according to the present example, the irradiation amount of the argon atomic beam was increased to 360 kJ. The results were shown in Table 2.

According to the Comparative example 3, the oxygen concentration at the central part was the same as the oxygen concentration at the peripheral part of the amorphous layer 8, the argon concentration and thickness at the central part were smaller than the argon concentration and thickness at the peripheral part of the amorphous layer, and the SORI upon heating at 80° C. was as large as 610 μm.

Further, according to the Inventive examples 1 and 2 and Comparative examples 1 to 3, although the composition of the bonding layer 2A was $Si_{(1-x)}O_x$ (x=0.05), it is not limited thereto. In the case that the bonding layer 2A has a composition of $Si_{(1-x)}O_x$ (0.008≤x≤0.408), the warping can be reduced, while the insulating property of the bonded body 5, 5A, 15 or 15A can be assured.

The invention claimed is:

1. A bonded body comprising:
   a piezoelectric single crystal substrate;
   a supporting substrate comprising a polycrystalline ceramic material or a single crystal material;
   a bonding layer provided on said piezoelectric single crystal substrate and having a composition of $Si_{(1-x)}O_x$, wherein (0.008≤x≤0.408); and
   an amorphous layer provided between said supporting substrate and said bonding layer, said amorphous layer comprising oxygen atoms and argon atoms,
      wherein a concentration of said oxygen atoms at a central part of said amorphous layer is higher than a concentration of said oxygen atoms at a peripheral part of said amorphous layer.

2. The bonded body of claim 1, wherein a concentration of said argon atoms at said central part of said amorphous layer is higher than a concentration of said argon atoms at said peripheral part of said amorphous layer.

3. The bonded body of claim 1, wherein a thickness at said central part of said amorphous layer is larger than a thickness at said peripheral part of said amorphous layer.

4. The bonded body of claim 1, further comprising an intermediate layer provided between said piezoelectric single crystal substrate and said bonding layer and having a composition of $SiO_2$.

5. The bonded body of claim 1, wherein said supporting substrate comprises a material selected from the group consisting of silicon, sapphire, mullite, cordierite, translucent alumina and sialon.

6. The bonded body of claim 1, wherein said piezoelectric single crystal substrate comprises lithium niobate, lithium tantalate or lithium niobate-lithium tantalate solid solution.

7. An acoustic wave device comprising:
   said bonded body of claim 1; and
   an electrode provided on said piezoelectric single crystal substrate.

* * * * *